United States Patent [19]

Sugimoto et al.

[11] Patent Number: 5,199,435

[45] Date of Patent: Apr. 6, 1993

[54] MAGNETIC RESONANCE IMAGING SYSTEM

[75] Inventors: Hiroshi Sugimoto, Nishinasunomachi; Hirokazu Suzuki, Ootawara, both of Japan

[73] Assignee: Kabushiki Kaisha Toshiba, Kawasaki, Japan

[21] Appl. No.: 536,187

[22] Filed: Jun. 11, 1990

[30] Foreign Application Priority Data

Jun. 13, 1989 [JP] Japan .................. 1-150192

[51] Int. Cl.$^5$ .................................................. A61B 5/055
[52] U.S. Cl. ............................. 128/653.2; 128/653.3
[58] Field of Search ............ 128/653 A, 653 AF, 306; 324/307, 309, 311, 318

[56] References Cited

U.S. PATENT DOCUMENTS

| | | | |
|---|---|---|---|
| 4,628,264 | 12/1986 | Rzedzian | 324/318 |
| 4,727,327 | 2/1988 | Toyoshima et al. | 324/309 |
| 4,849,210 | 7/1989 | Widder | 128/653.4 |
| 4,906,932 | 3/1990 | Ordidge | 324/309 |
| 4,932,411 | 6/1990 | Fritschy et al. | 324/318 |
| 4,980,148 | 12/1990 | Dean | 128/654 |
| 5,016,637 | 5/1991 | Koizumi et al. | 324/309 |
| 5,094,837 | 3/1992 | Bis | 128/653.4 |

FOREIGN PATENT DOCUMENTS 64-47912  8/1987  Japan .

OTHER PUBLICATIONS

Book of Abstracts, vol. I "A Rapid Starburst Pulse Sequence For Cardiac Tagging" p. 23, Aug. 12, 1989–Aug. 18, 1989.

*Primary Examiner*—Ruth S. Smith
*Assistant Examiner*—Krista M. Pfaffle
*Attorney, Agent, or Firm*—Limbach & Limbach

[57] ABSTRACT

A magnetic resonance imaging system selectively excites a plurality of predetermined first regions of an object to cause an magnetic resonance, selectively excites at least one predetermined second region intersecting the first regions to cause an magnetic resonance before the magnetic resonance is relaxed, collects a magnetic resonance signal, and acquires a magnetic resonance image of the second region based on the magnetic resonance signal.

18 Claims, 13 Drawing Sheets

MAGNETIC RESONANCE IMAGING SYSTEM

BACKGROUND OF THE INVENTION

1. Field of the Invention

The present invention generally relates to a magnetic resonance (MR) imaging system which utilizes an MR phenomenon to acquire structural information, such as a slice image of an object (particularly, a living subject), and functional information, such as spectroscopy. More particularly, the present invention is directed to an MR imaging system suitable for imaging information of motion at a plurality of portions aligned in one direction, such as the blood speeds in renal veins of left and right kidneys.

2. Description of the Related Art

The MR phenomenon is a phenomenon such that a nucleus, which is placed in a static field and has a non-zero nuclear spin accompanied by a magnetic moment, resonantly absorbs and emits only an electromagnetic wave having a specific frequency. This nucleus resonates at an angular frequency $\omega_0$ ($\omega_0 = 2\pi\nu_0$; $\nu_0$: Larmor frequency) expressed by the following formula:

$$\omega_0 = \gamma H_0$$

where $\gamma$ is a gyromagnetic ratio specific to the type of a nucleus and $H_0$ is a static field intensity.

In a system utilizing such an MR phenomenon to examine and diagnose, for example, a living subject, an electromagnetic wave, induced by the aforementioned resonance absorption and having the same frequency as the aforementioned specific frequency (resonance frequency), is detected and is subjected to signal processing to thereby acquire diagnosis information, such as a slice image of an object, which reflects information about a nucleus density, a longitudinal relaxation time $T_1$, a transverse relaxation time $T_2$, the motion of a tissue like the flow of a humor or a chemical shift, without being invaded.

In collecting diagnosis information by a magnetic resonance, it is possible to excite any portion of an object placed in a static field to cause a magnetic resonance and collect an MR signal. Because of the structural restriction to the MR imaging apparatus and clinical demand of a specific portion to be imaged, however, the existing MR imaging apparatuses excite a limited target portion to cause a magnetic resonance and collect an MR signal resulting from the excitation.

In this case, a specific portion to be imaged is generally a sliced portion (a slice) with a certain thickness, and an MR signal, such as an MR echo signal (hereinafter referred to as echo signal) produced at the slice or an FID (Free Induction Decay) signal, is collected by performing excitation of a magnetic resonance which involves a plurality of encoding steps. An image reconstruction is done using such collected MR data in, for example, a two-dimensional Fourier transformation, to provide the image of the specific slice.

The use of such an MR imaging method can provide the imaging of a blood speed. The present applicant has already proposed, as such an imaging method, a method of acquiring blood speed information and tomographic image information together to provide a tomographic image including a blood speed image. This method is the MR imaging method disclosed in the Japanese Patent Application No. 62-204447 filed Aug. 18, 1987 and laid open as the Published Unexamined Japanese Patent Application No. 64-47912. According to this method, a first slice normal to a blood vessel is excited and imaging of a second slice including this blood vessel is executed upon elapse of a predetermined time. In this case, the second slice is excited to cause a magnetic resonance, with the nuclear-spin originated magnetization of the first slice being saturated. When the second slice is excited, the first slice hardly produces an MR signal, so that the image of the second slice shows a portion belonging to the first slice as a blank portion. The pre-excitation of the first slice to form a blank portion in the image of the second slice is called "tagging." With the use of the image of the second slice, it is possible to know the distance blood travels in the aforementioned predetermined time from the positional relation between a blank portion (or a tagged portion) of a blood vessel portion and a blank portion of the other non-moving portion. Based on the distance L over which the blood has moved and the difference in excitation time between the first and second slices, i.e., the moving time T, the blood speed, L/T, can be computed. Information about the speed of a cerebrospinal fluid (CSF) can also be imaged using a similar method.

The conventional method can provide the above image through a sequence of the aforementioned imaging procedures even if a target portion include a plurality of blood vessels as long as they are parallel to one another. If the target portion include blood vessels not running in parallel, such as renal veins those of which from the left kidney and those from the right kidney join, and moreover, if it is significant to compare information on the left kidney and that on the right kidney, however, the conventional method should repeat the mentioned sequence of imaging procedures, one for the blood vessels from the left kidney and the other for those from the right kidney.

This involves a large time lag between the two sequences of imaging procedures, so that the resultant two pieces of information, which should be compared with each other at the same point of time, inevitably reflect the large time difference and cannot be compared at high accuracy. The execution of a sequence of imaging procedures twice takes a considerable amount of time for the imaging, thus impairing the imaging efficiency.

SUMMARY OF THE INVENTION

Accordingly, it is an object of the present invention to provide an MR imaging system capable of imaging information of motion, which crosses different panes, at a plurality of locations to be compared at nearly the same timing, such as blood speed information of a blood vessel system having a plurality of blood vessels that join.

The MR imaging system of the present invention causes selective exciting means to selectively excite a plurality of predetermined first regions of an object to cause an magnetic resonance, selectively excites at least one predetermined second region crossing these first regions to cause an magnetic resonance before the magnetic resonance caused by the selective exciting means is relaxed, collects an MR signal, and acquires a magnetic resonance image of the second region based on the MR signal.

Accordingly, the second region is imaged and this image has a plurality of blank portions due to the first regions being pre-excited. Based on the locations of the blank portions, therefore, information of motion of a plurality of tissues can be acquired from information of the moving distances of these tissues and information of moving times based on the difference in excitation times. As these pieces of motion information appear on the same image, they can be easily compared with one another. Further, since these pieces of motion information are obtained by executing a single sequence of imaging procedures, there hardly is a time lag so that the information can be compared at high accuracy and high efficiency.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

Preferred embodiments of this invention will now be described referring to the accompanying drawings.

Figure 1:
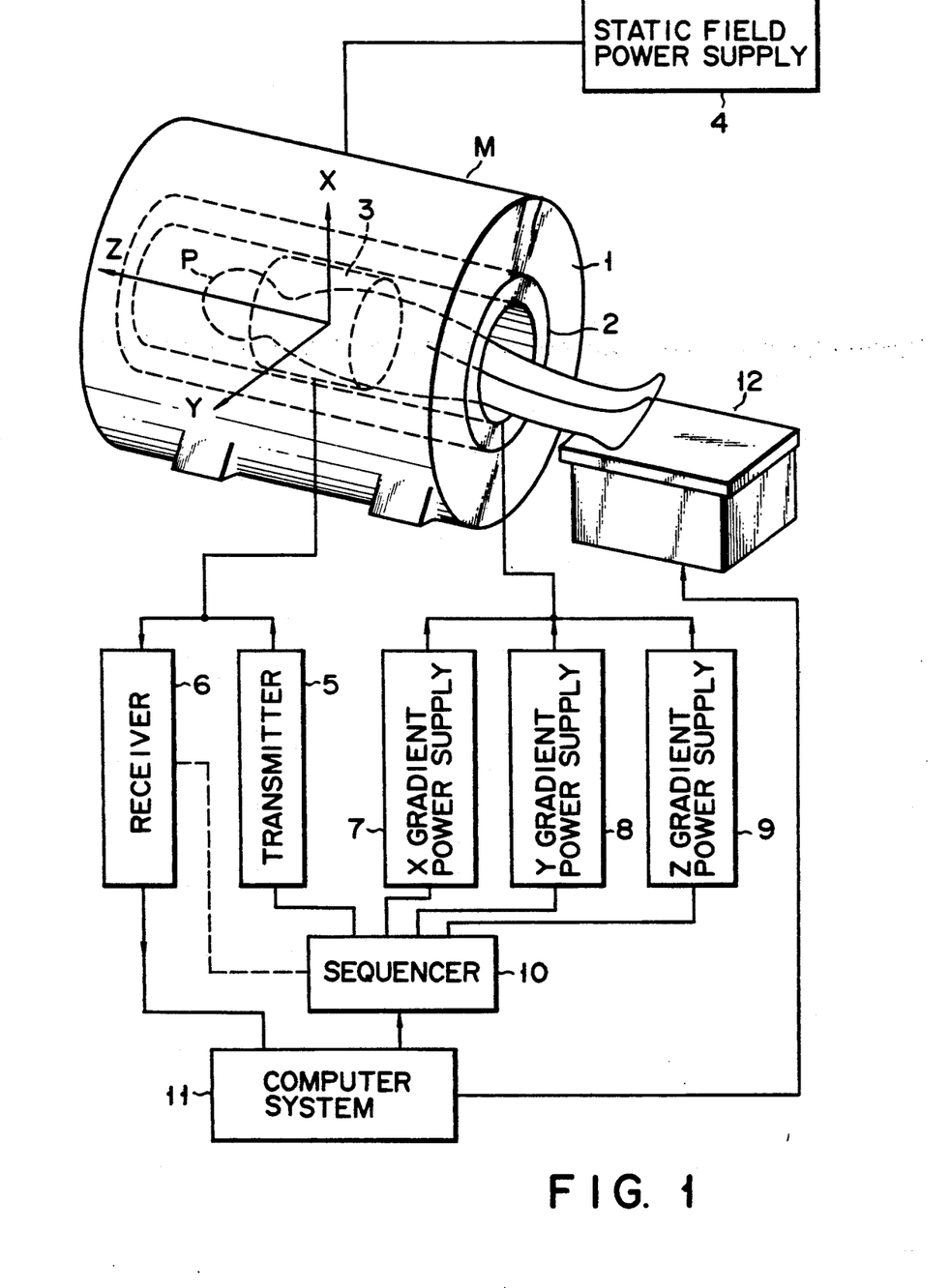
FIG. 1 is a block diagram illustrating the arrangement of the first embodiment of an MR imaging system according to the present invention.
Figure 2:
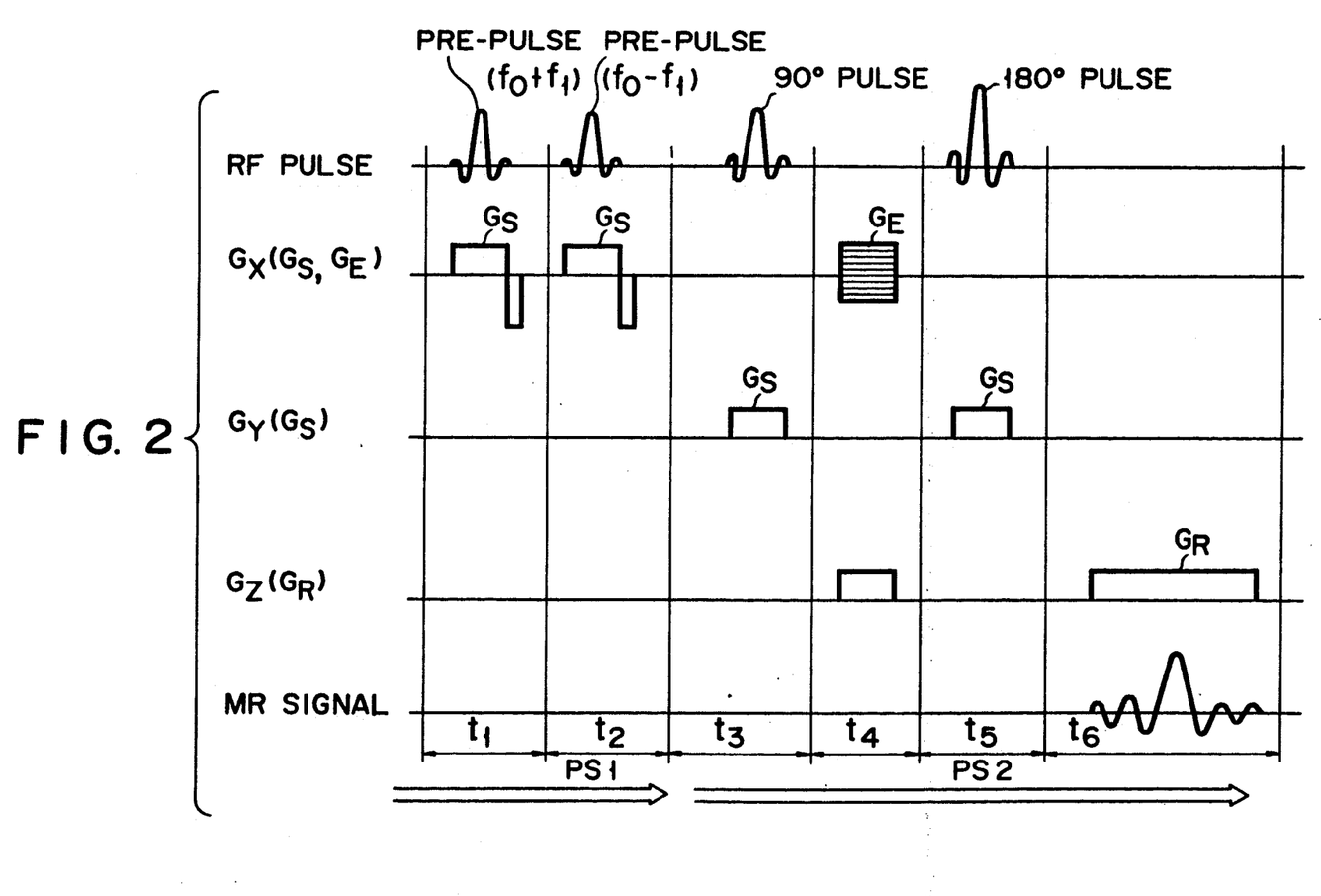
FIG. 2 is a timing chart illustrating one of the encoding steps of a pulse sequence for the first embodiment shown in FIG. 1.

FIG. 1 illustrates the arrangement of the first embodiment of an MR imaging system according to the present invention, and FIG. 2 illustrates one of the encoding steps of a pulse sequence in this system.

The MR imaging system shown in FIG. 1 comprises a magnet assembly M, a static field power supply 4, a transmitter 5, a receiver 6, X, Y and Z gradient power supply 7, 8 and 9, a sequencer 10, a computer system 11 and a couch 12. The magnet assembly M has a static field coil 1, a gradient coil 2 and a probe 3.

The static field coil 1 is an electromagnetic coil of a normal conductive or super conductive type for generating a homogeneous static magnetic field, and the coil 1 may be added with a shim coil for compensation of a static magnetic field. The gradient coil 2 generates X, Y and Z gradient magnetic fields $G_X$, $G_Y$ and $G_Z$ having magnetic gradients (normally linear magnetic gradients) in the X, Y and Z directions. These gradient fields $G_X$, $G_Y$ and $G_Z$ are mainly used to give potential information of those regions which are excited to cause a magnetic resonance, to an MR signal induced by the magnetic resonance. The probe 3 comprises a coil system for transmitting an RF (Radio Frequency) pulse of a high frequency field normally having a pulse-shaped envelope, and detecting an MR signal inducted by the magnetic resonance. The coil system of the probe 3 may comprise two types of coils, one for transmission and the other for reception, or a transmission/reception coil used both for transmission and reception. The magnet assembly M has a hollow section where an object P is to be placed, and an imaging area is formed in the hollow section. The static field power supply 4 includes a circuit for mainly supplying a drive current to the static field coil 1 and controlling, if necessary, energizing of the coil 1. The transmitter 5 transmits an RF pulse, through the probe 3, to the object P located at the imaging area. The receiver 6 receives, through the probe 3, an MR signal induced by a magnetic resonance. The X, Y and Z gradient power supplies 7, 8 and 9 control excitation of the gradient coil 2 to generate gradient fields in the X, Y and Z directions, respectively. The sequencer 10 controls the transmitter 5, gradient power supplies 7 to 9, and, if necessary, the receiver 6 to execute a pulse sequence as shown in, for example, FIG. 2. The computer system 11 controls the sequencer 10 and couch 12, executes signal processing of the MR signal received by the receiver 6 and displays an image acquired through the signal processing. The couch 12 moves a patient platform on which the object P is placed, for positional adjustment of the object P for an imaging process under the control of the computer system 11.

The sequencer 10 when operated executes the sequence shown in FIG. 2. According to the sequence in FIG. 2, the transmitter 5 is driven and an RF pulse (90° pulse or 180° pulse) as a rotating field is applied to the object P from the transmission coil of the probe 3, while the gradient power supplies 7, 8 and 9 are driven to cause the gradient coil 2 to apply the X gradient field $G_X$, Y gradient field $G_Y$ and Z gradient field $G_Z$ as a slicing gradient field $G_S$, a phase-encoding gradient field $G_E$ and a reading gradient field $G_R$ to the object P, respectively. An MR signal of a specific portion of the object P is received through the probe 3 by the receiver 6 and is collected by the computer system 11. Repetitively executing the sequence shown in FIG. 2 for a predetermined number of times while sequentially changing the amplitude of the gradient field $G_E$ provides a group of MR data necessary to acquire a slice image.

The sequence in FIG. 2 will now be described in detail.

Figure 3:
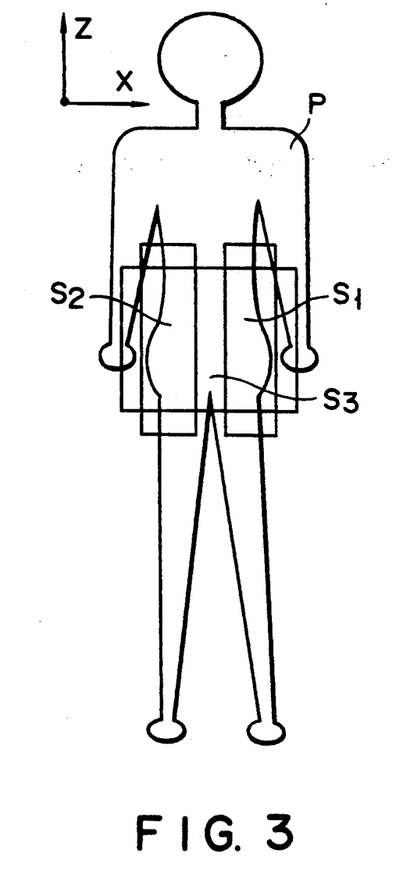
FIG. 3 is an exemplary diagram showing regions of an object to be excited for a magnetic resonance for explaining the embodiment shown in FIG. 1.

By applying a first pre-pulse consisting of a 90° selective excitation pulse as an RF pulse to the object P while applying the X gradient field $G_X$ as the slicing sagittal slice $S_1$ of the object P as shown in, for example, FIG. 3 is selectively excited to cause a magnetic resonance. Then, by applying a second pre-pulse consisting of a 90° selective excitation pulse as an RF pulse to the object P while applying the X gradient field $G_X$ having the same sign as the above-mentioned gradient field $G_X$ as the slicing gradient field $G_S$ to the object P in a period $t_2$, a sagittal slice $S_2$ of the object P is selectively excited to cause a magnetic resonance.

Figure 4:
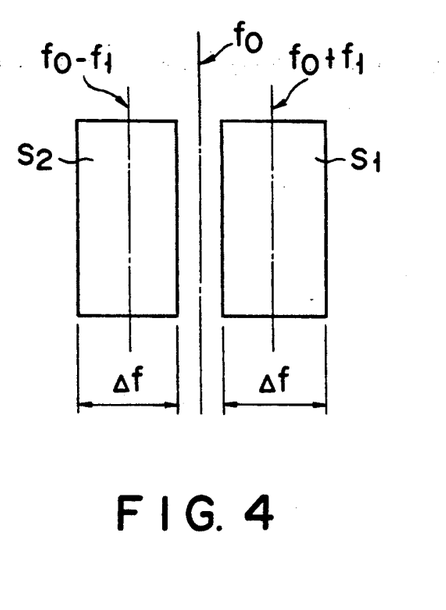
FIG. 4 is an exemplary diagram illustrating selective saturation regions for explaining the embodiment shown in FIG. 1.
Figure 5:
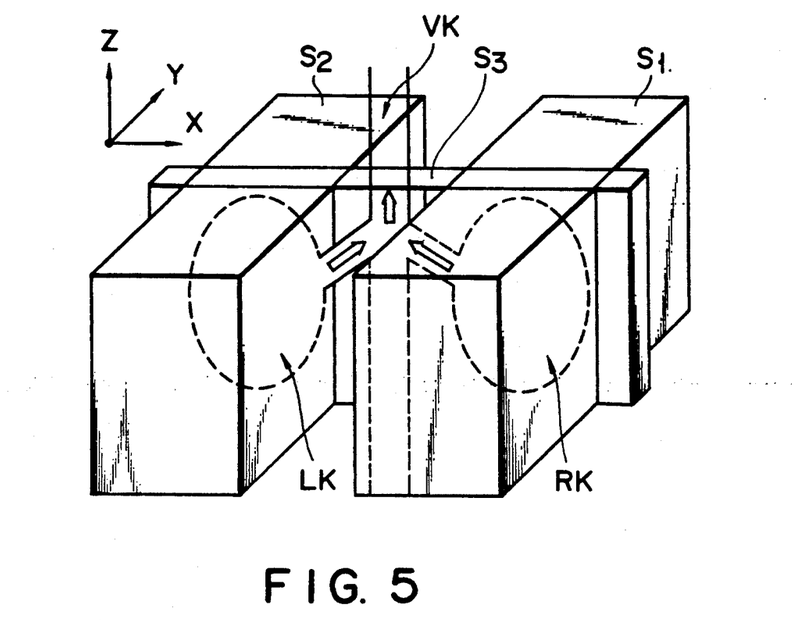
FIG. 5 is an exemplary diagram illustrating the correlation between the selective saturation regions, the regions whose MR data are collected, and the kidneys and renal veins of the object, for explaining the embodiment shown in FIG. 1.

The magnetic resonances of the two sagittal slices $S_1$ and $S_2$ are caused by using the X gradient fields $G_X$ of the same sign as the slicing gradient field $G_S$ and applying 90° pulses (selective excitation pulses) having different center frequencies $f_0+f_1$ and $f_0-f_1$ and the same band frequency $\Delta f$ (corresponding to depths of the sagittal slices $S_1$ and $S_2$ in the X direction) (See FIGS. 4 and 5.) As shown in FIG. 5, the sizes and locations of the sagittal slices $S_1$ and $S_2$ are so set that $S_1$ includes the main portion of the right kidney RK and $S_2$ includes the main portion of the left kidney LK. The excitation of the magnetic resonance of the sagittal slices $S_1$ and $S_2$ are intended to selectively saturate the spin magnetization of $S_1$ and $S_2$ so that no magnetic resonance is caused in these portions by the next excitation of the object P. Therefore, the processes following a period $t_3$ are executed before relaxation of the magnetic resonance induced by these excitations (longitudinal relaxation) advances so much.

In the period $t_3$, the 90° selective excitation pulse (as an RF pulse) and the Y gradient field $G_Y$ (as the slicing gradient field $G_S$) are applied to the object P to excite a coronal slice $S_3$ for a magnetic resonance; as shown in FIGS. 3 and 5, the coronal slice $S_3$ crosses the two sagittal slices $S_1$ and $S_2$, for example, at 90 degrees, and includes renal veins VK. In the subsequent period $t_4$, the X gradient field $G_X$ (as the phase-encoding gradient field $G_E$) having a variable amplitude (gradient intensity) and the Z gradient field $G_Z$ for compensation of the reading gradient field $G_R$ are applied to the object P (applying the latter gradient field $G_Z$ may not be necessary at this point of time in some cases). In the next period $t_5$, a 180° pulse as an RF pulse to refocus the spin magnetization dispersed to generate an MR echo and the Y gradient field $G_Y$ as the slicing gradient field $G_S$ are applied to the object P. Applying the latter gradient field $G_S$ may not be necessary at this point of time in some cases.

In the subsequent period $t_6$, an MR echo signal as an MR signal induced by the above process is collected through the probe 3 while the Z gradient field $G_Z$ as the reading gradient field $G_R$ is applied.

The above sequential process corresponds to one of the encoding steps used in the data collection for imaging a specific portion of the object P. In the sequential process, $t_1$ to $t_2$ are a procedure PS1 for exciting the two sagittal slices $S_1$ and $S_2$ for a magnetic resonance to saturate the spin magnetization at these portions, and $t_3$ to $t_6$ are a procedure PS2 for exciting the coronal slice $S_3$ for a magnetic resonance and collecting MR data to image this portion. This sequential process is repeatedly executed while sequentially changing the amplitude of the encoding gradient field $G_E$ (gradient intensity) in the period $t_4$ to collect an echo signal for each process. The echo signals thus acquired are subjected to image reconstruction to provide a slice image of the coronal slice $S_3$.

According to this embodiment, as described above, the selective saturation procedure PS1 ($t_1-t_2$) is executed prior to the normal MR excitation/MR data collection procedure PS2 ($t_3-t_6$), so that a slice image $S_3'$ of the coronal slice $S_3$ showing the right kidney RK' and left kidney LK' as black portions and having an image VK' of the renal veins is displayed on a display screen 11A. In displaying the slice image, since showing the right kidney RK' and left kidney LK' as blank portions makes it difficult to grasp this image, the image is generally superimposed on a slice image of the coronal slice $S_3$ which is acquired by execution of only the procedure PS2 in FIG. 2 in advance.

Figure 6:
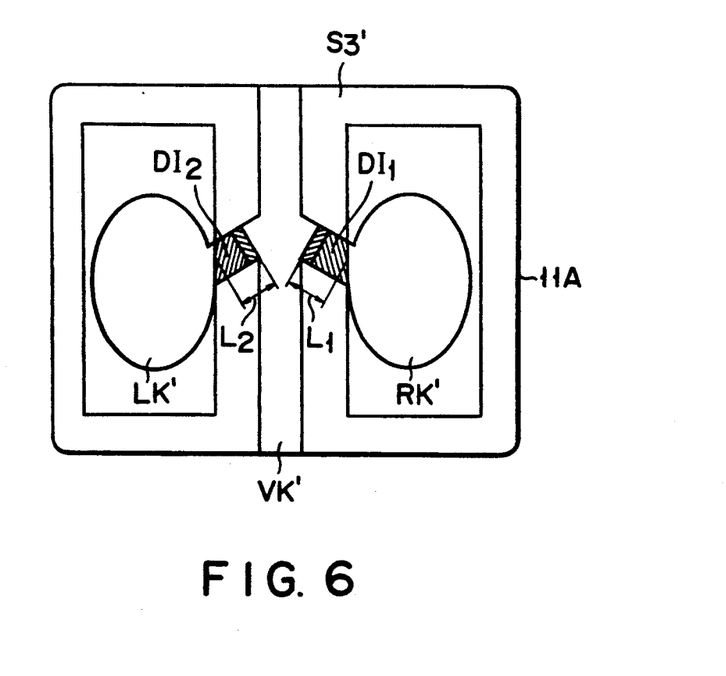
FIG. 6 is an exemplary diagram illustrating a display image for explaining the embodiment shown in FIG. 1.

Given that TS1, TS2 and TS3 are the excitation reference time for the sagittal slice $S_1$ including the right kidney RK, the excitation reference time for the sagittal slice $S_2$ including the left kidney LK and the excitation/data collection reference time for the coronal slice $S_3$ including the renal veins VK, respectively, blank portions $DI_1$ and $DI_2$ as indicated by the hatched regions in FIG. 6 are produced according to an elapsed time TS13 between TS1 and TS3 and an elapsed time TS23 between TS2 and TS3.

For instance, the blood in the right kidney RK where a magnetic resonance is caused at the excitation reference time TS1 moves by the illustrated distance $L_1$ at the excitation/data collection reference time TS3 and the portion of the blood moved is shown as the blank portion $DI_1$. Likewise, the blood in the left kidney LK where a magnetic resonance is caused at the excitation reference time TS2 moves by the illustrated distance $L_2$ at the excitation/data collection reference time TS3 and the portion of the blood moved is shown as the blank portion $DI_2$.

The blood speed in the renal veins from the right kidney RK is computed as $L_1/TS13$, and the blood speed in the renal veins from the left kidney LK as $L_2/TS23$.

According to this embodiment, blood speed information of the renal veins VK from the right and left kidney RK and LK at substantially the same time can be acquired and can be compared on a single screen. Further, since these pieces of information can be acquired by executing a sequence of imaging procedures once, they can be compared at high accuracy with less influence by the time difference, and the kidney function can be diagnosed efficiently.

Pulse sequences as shown in FIGS. 7 to 15 in addition to the one shown in FIG. 2 can be used to realize the present invention.

Figure 7:
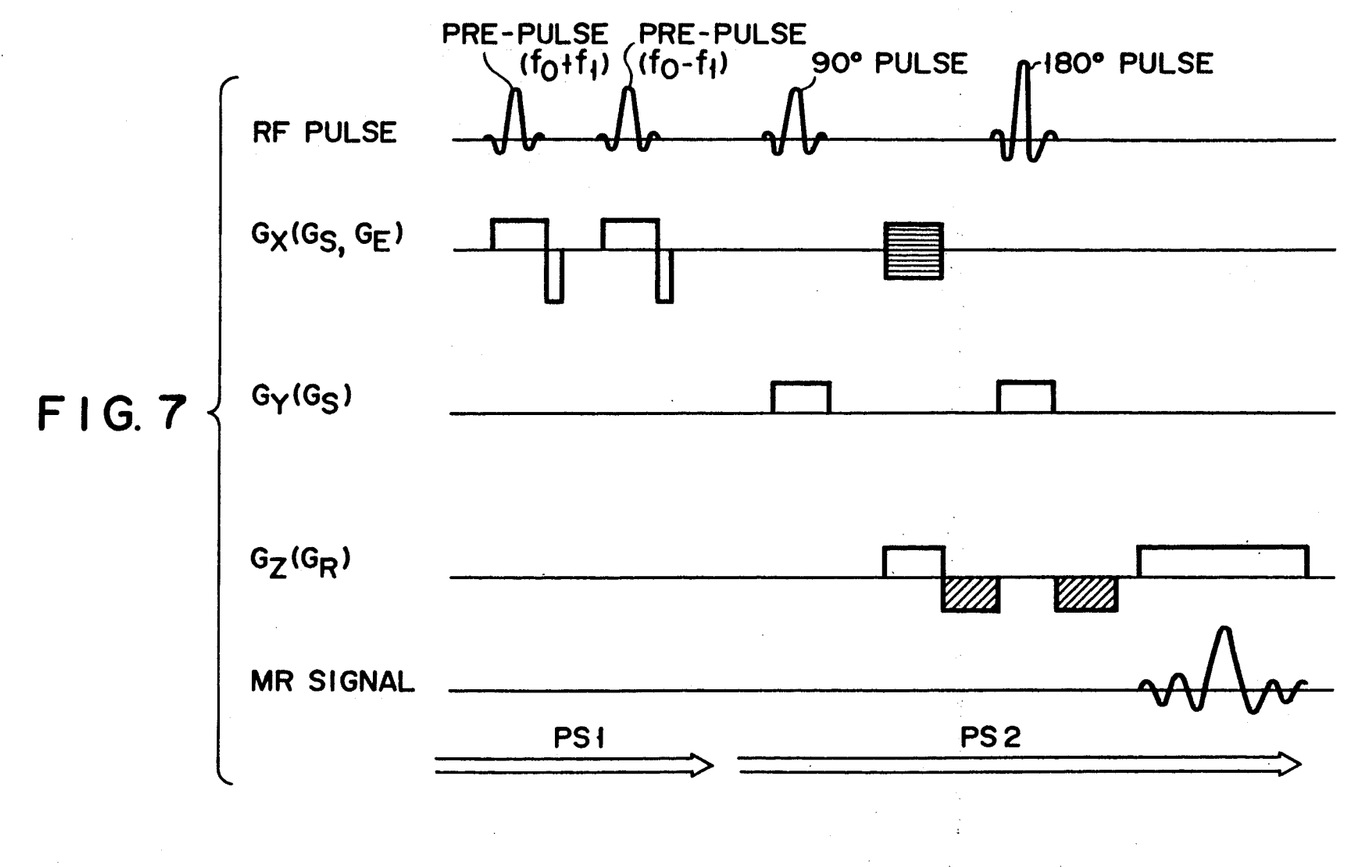
FIGS. 7 through 15 are diagrams illustrating one of the encoding steps of a pulse sequence according to the second to tenth embodiments, respectively.

FIG. 7 illustrates the pulse sequence for use in the second embodiment of an MR imaging system according to this invention. In this embodiment, a gradient pulse (indicated by the hatched regions in FIG. 7) for compensating a phase shift caused by the blood flow is added to the Z gradient field $G_Z$ for reading ($G_R$) of the excitation/data collection procedure PS2 in the pulse sequence shown in FIG. 2. This pulse sequence compensates a phase shift caused by the blood flow, thus providing a highly-accurate image and highly-accurate blood speed information as a consequence.

Figure 8:
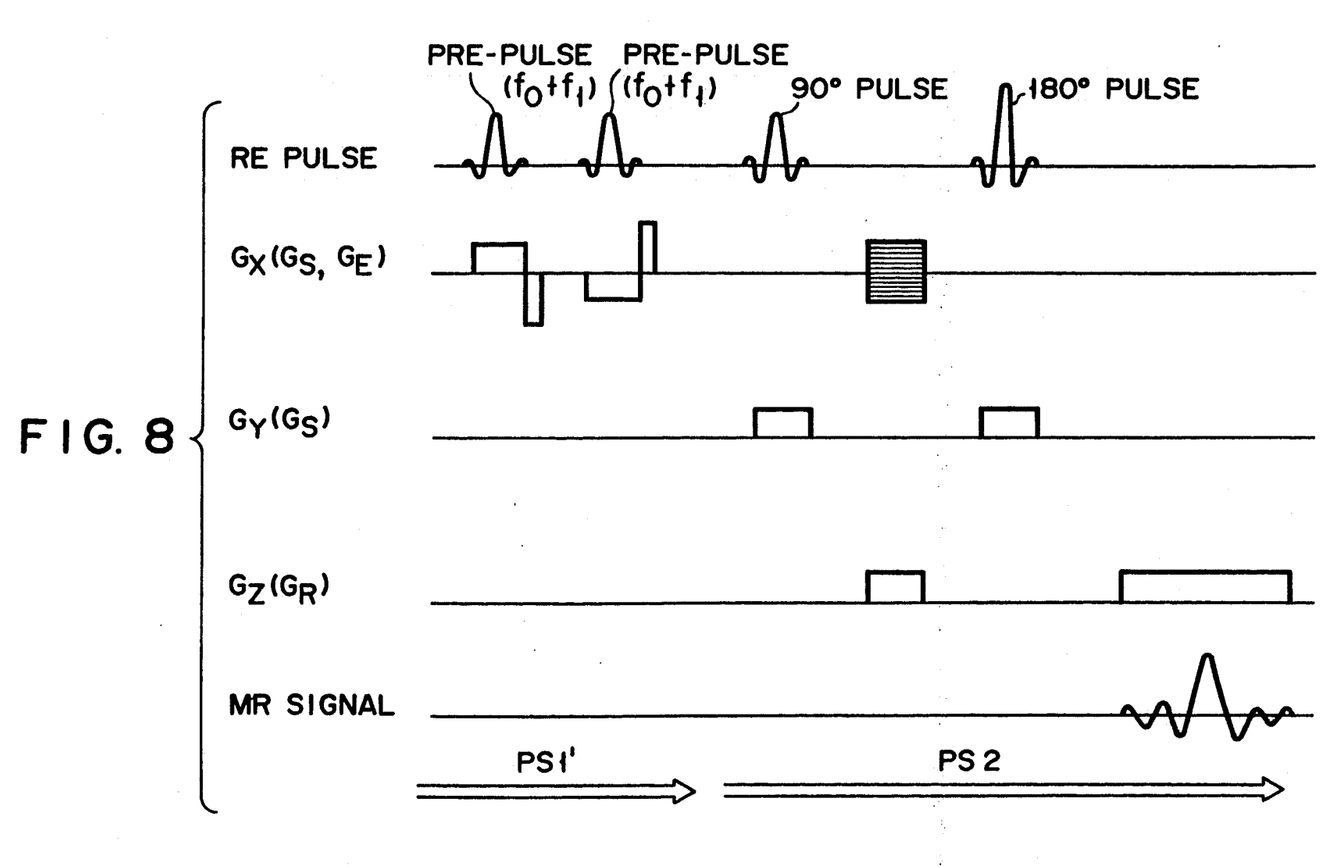

FIG. 8 illustrates the pulse sequence for use in the third embodiment of an MR imaging system according to this invention. In this embodiment, the saturation procedure $PS_1$ in the pulse sequence in FIG. 2 is replaced by a saturation procedure PS1' where excitation of a magnetic resonance for selectively saturating the sagittal slices $S_1$ and $S_2$ is done by applying the X gradient fields $G_X$ for slicing ($G_S$), which have different signs, and 90° pulses having the same band frequency $\Delta f$ and the same center frequency $f_0+f_1$.

Figure 9:
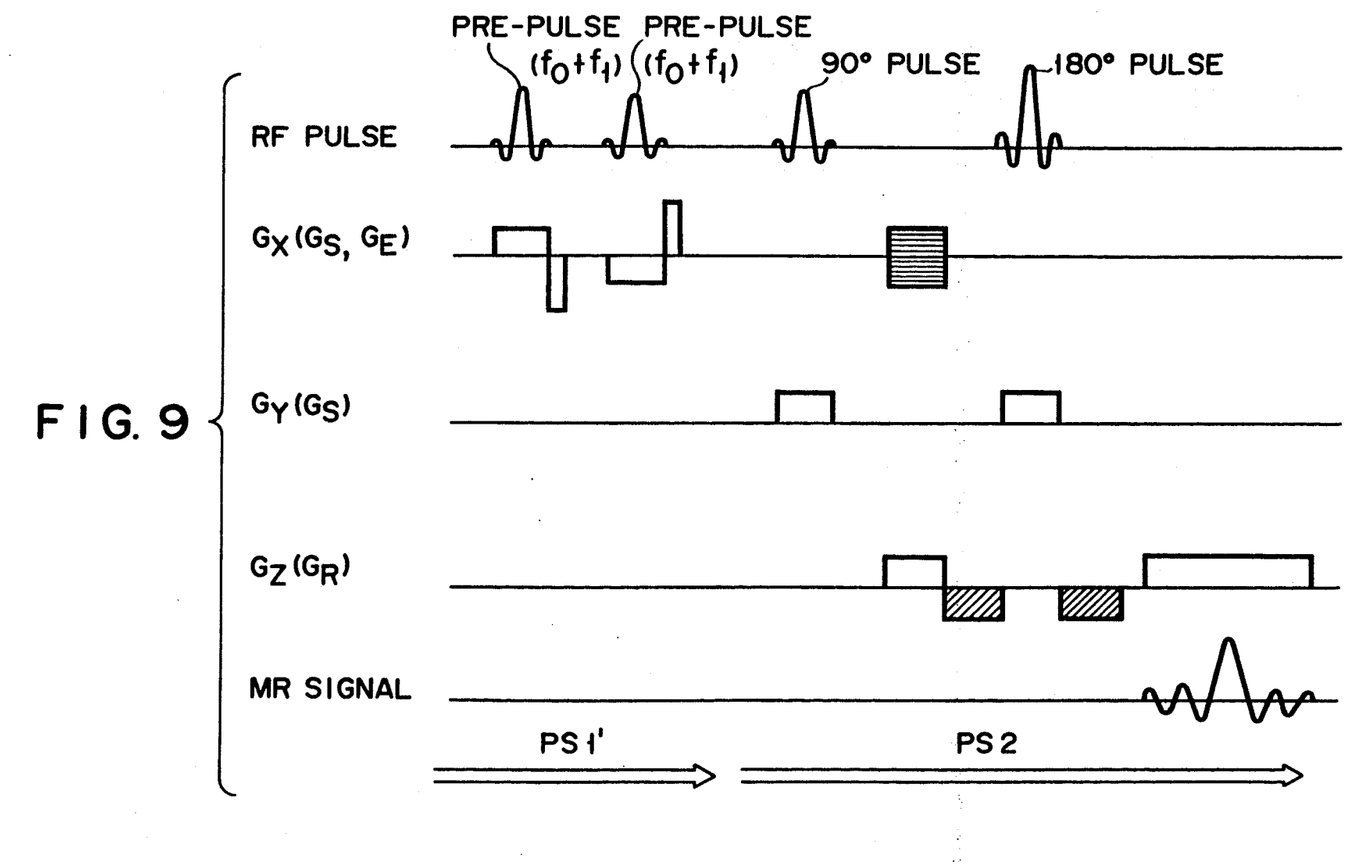

FIG. 9 illustrates the pulse sequence for use in the fourth embodiment of an MR imaging system according to this invention. In this embodiment, a gradient pulse (indicated by the hatched regions in FIG. 9) for compensating a phase shift caused by the blood flow is added the Z gradient field $G_Z$ for reading ($G_R$) of the excitation/data collection procedure PS2 in the pulse sequence shown in FIG. 8.

Figure 10:
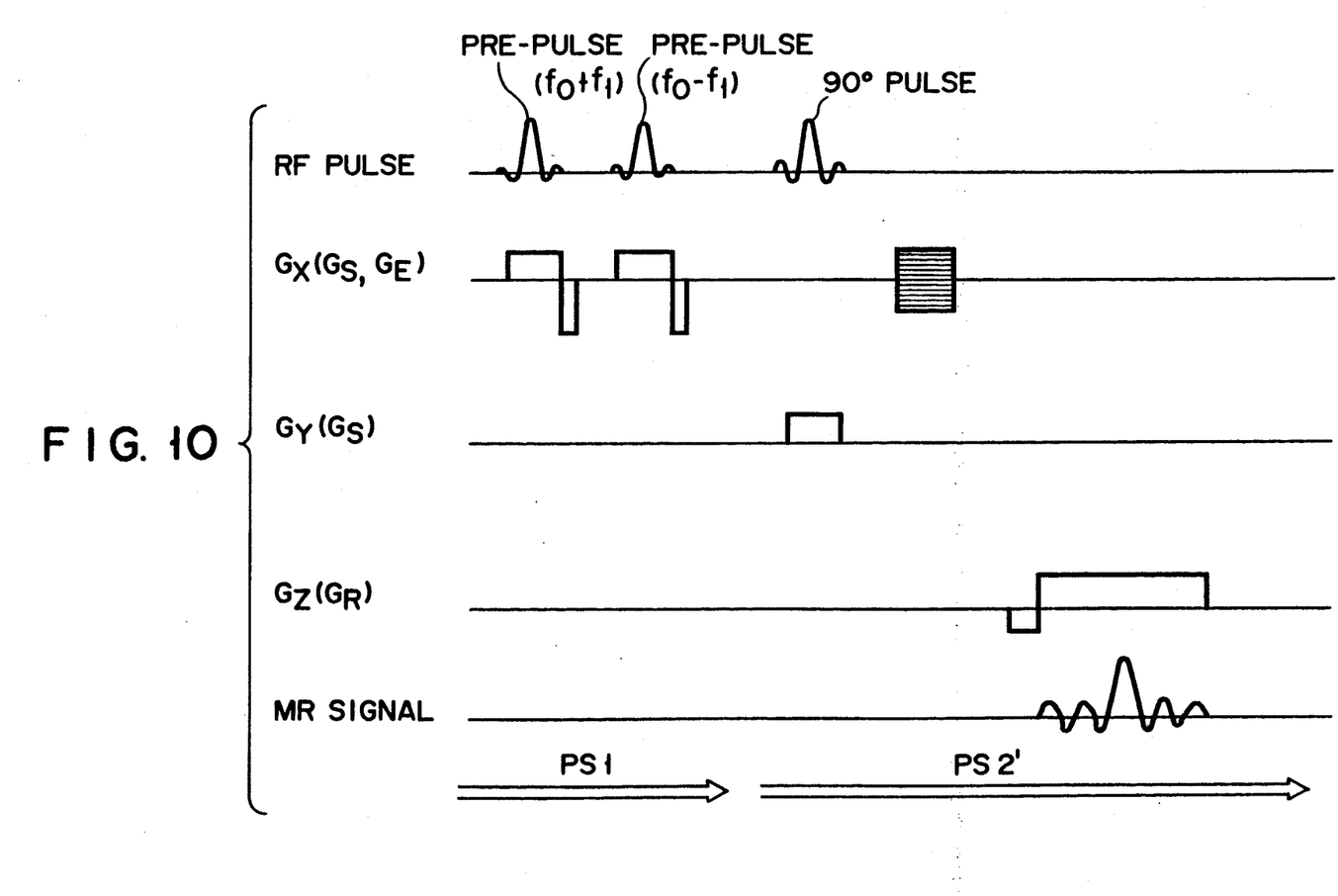

FIG. 10 illustrates the pulse sequence for use in the fifth embodiment of an MR imaging system according to this invention. In this embodiment, the excitation/data collection procedure PS2 in the pulse sequence in FIG. 2 is replaced by an excitation/data collection procedure PS2' in which the gradient field echo (FE) method that generates an MR echo by inverting the reading gradient field $G_R$, not using a 180° pulse. The excitation/data collection procedure PS2 in FIGS. 2 and 7-9 is executed by a pulse spin echo (SE) method that generates an MR echo by using a 180°.

Figure 11:
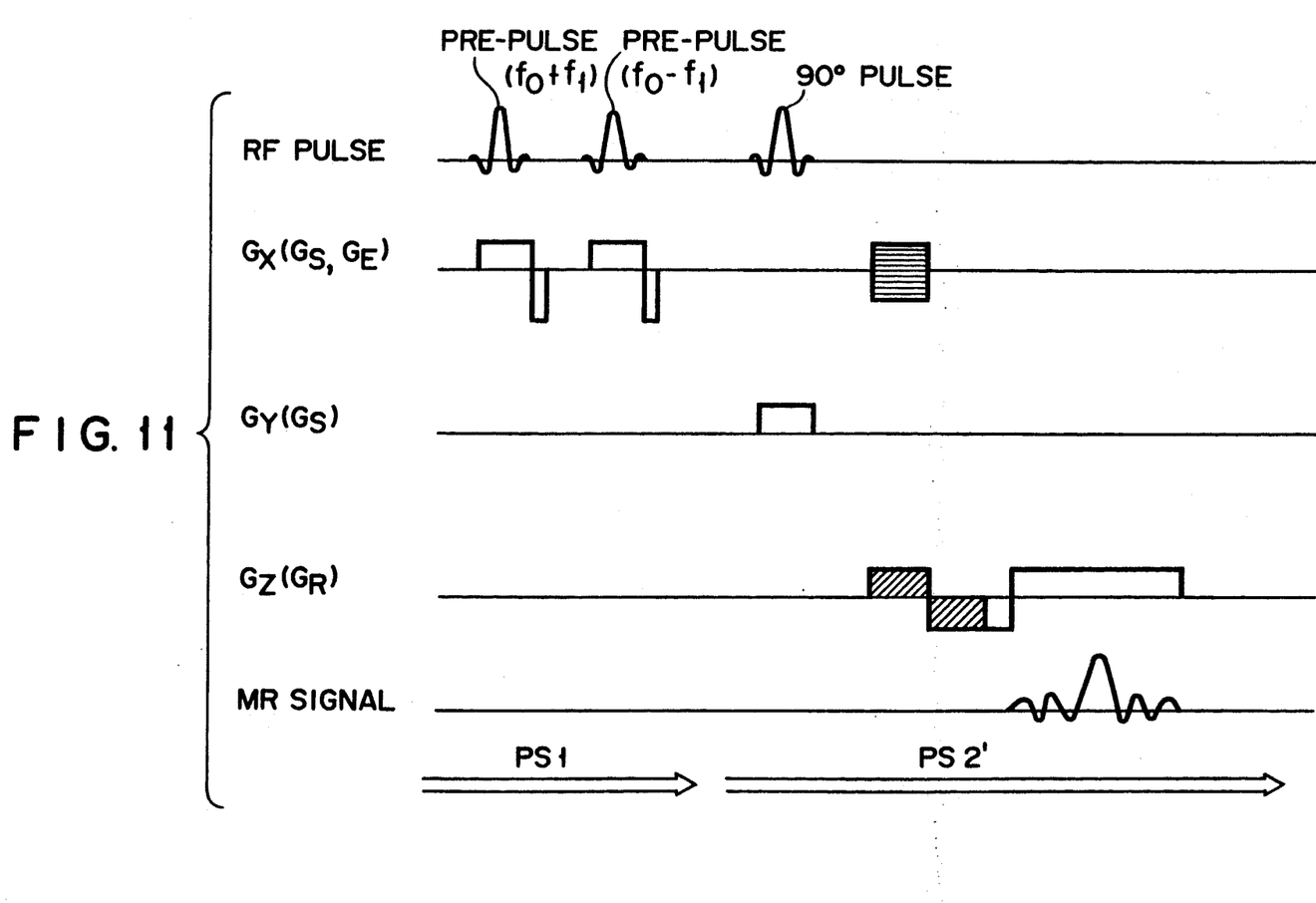

FIG. 11 illustrates the pulse sequence for use in the sixth embodiment of an MR imaging system according to this invention. In this embodiment, a gradient pulse (indicated by the hatched regions in FIG. 11) for compensating a phase shift caused by the blood flow is added to the Z gradient field $G_Z$ for reading ($G_R$) of the excitation/data collection procedure PS2' in the pulse sequence shown in FIG. 10.

Figure 12:
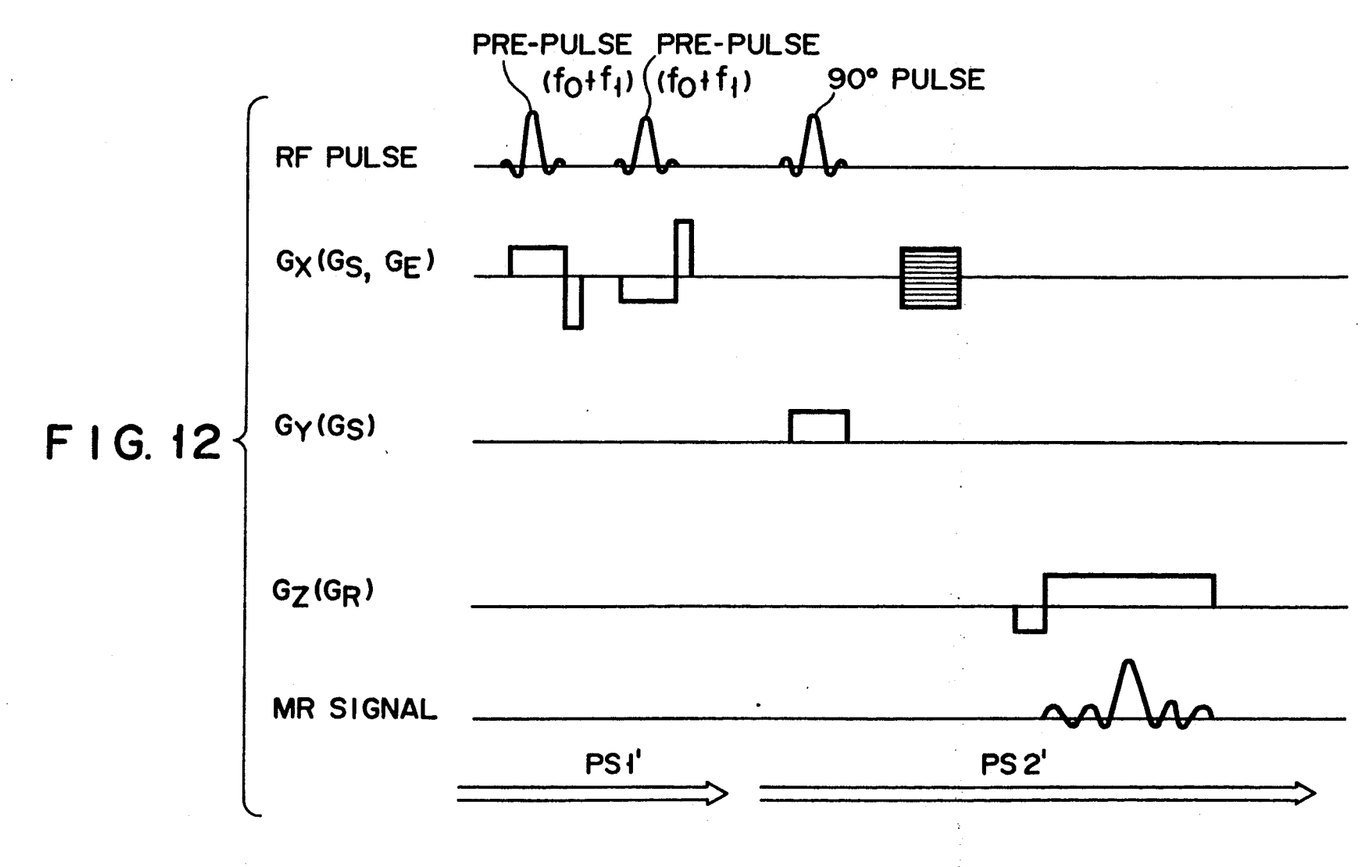

FIG. 12 illustrates the pulse sequence for use in the seventh embodiment of an MR imaging system according to this invention. In this embodiment, the saturation procedure PS1 in the pulse sequence in FIG. 10 is replaced by a saturation procedure PS1' similar to the one shown in FIG. 8 where excitation of a magnetic resonance for selectively saturating the sagittal slices S1 and S2 is done by applying the X gradient fields $G_X$ for slicing ($G_S$), which have different signs, and 90° pulses having the same band frequency Δf and the same center frequency $f_0 + f_1$.

Figure 13:
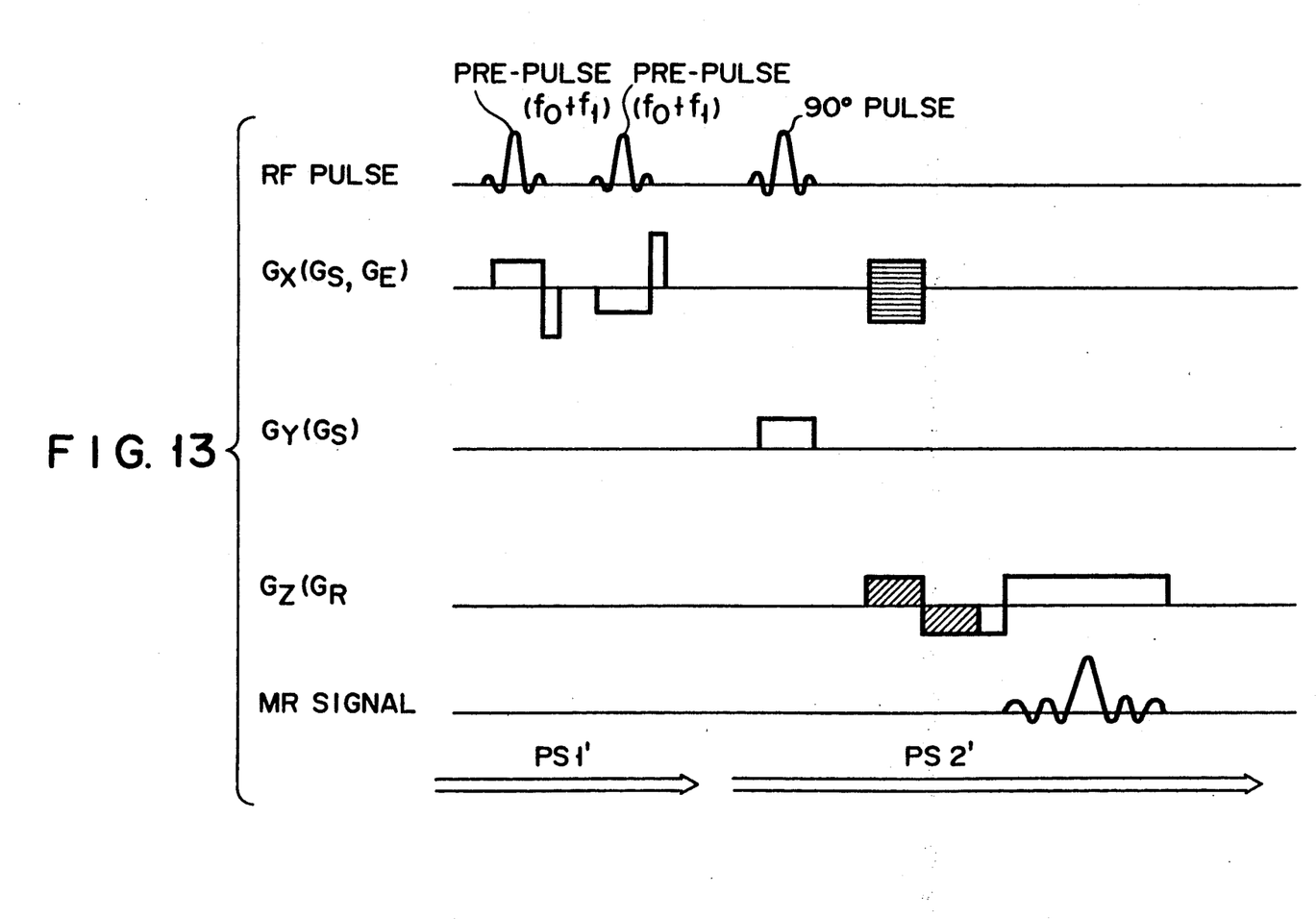

FIG. 13 illustrates the pulse sequence for use in the eighth embodiment of an MR imaging system according to this invention. In this embodiment, a gradient pulse (indicated by the hatched regions in FIG. 13) for compensating a phase shift caused by the blood flow is added to the Z gradient field $G_Z$ for reading ($G_R$) of the excitation/data collection procedure PS2 in the pulse sequence shown in FIG. 12.

In the individual embodiments, the amplitude or gradient intensity of a gradient field to be applied for image slicing at the time a plurality of portions are selectively excited by a pre-pulse, is constant and the portions to be saturated are altered by changing the carrier frequency of the pre-pulse. However, the portions to be saturated may be altered by changing the amplitude of the gradient field, with the frequency of the pre-pulse being constant. Although the directions of the gradient fields to be applied for image slicing at the time of selectively exciting a plurality of portions by a pre-pulse are set the same direction or opposite directions, a plurality of regions not parallel to one another on a slice image acquired by the imaging process may be selectively saturated if the directions of the gradient fields are made different for each portion to be saturated, by using a combined magnetic field of a plurality of gradient fields, for example.

Although a plurality of regions to be selectively saturated, i.e., the sagittal slices S1 and S2, are selectively and individually excited to be saturated by two selective excitations in the above embodiments, these regions can be selectively saturated at the same time if the regions are parallel sliced portions.

Figure 14:
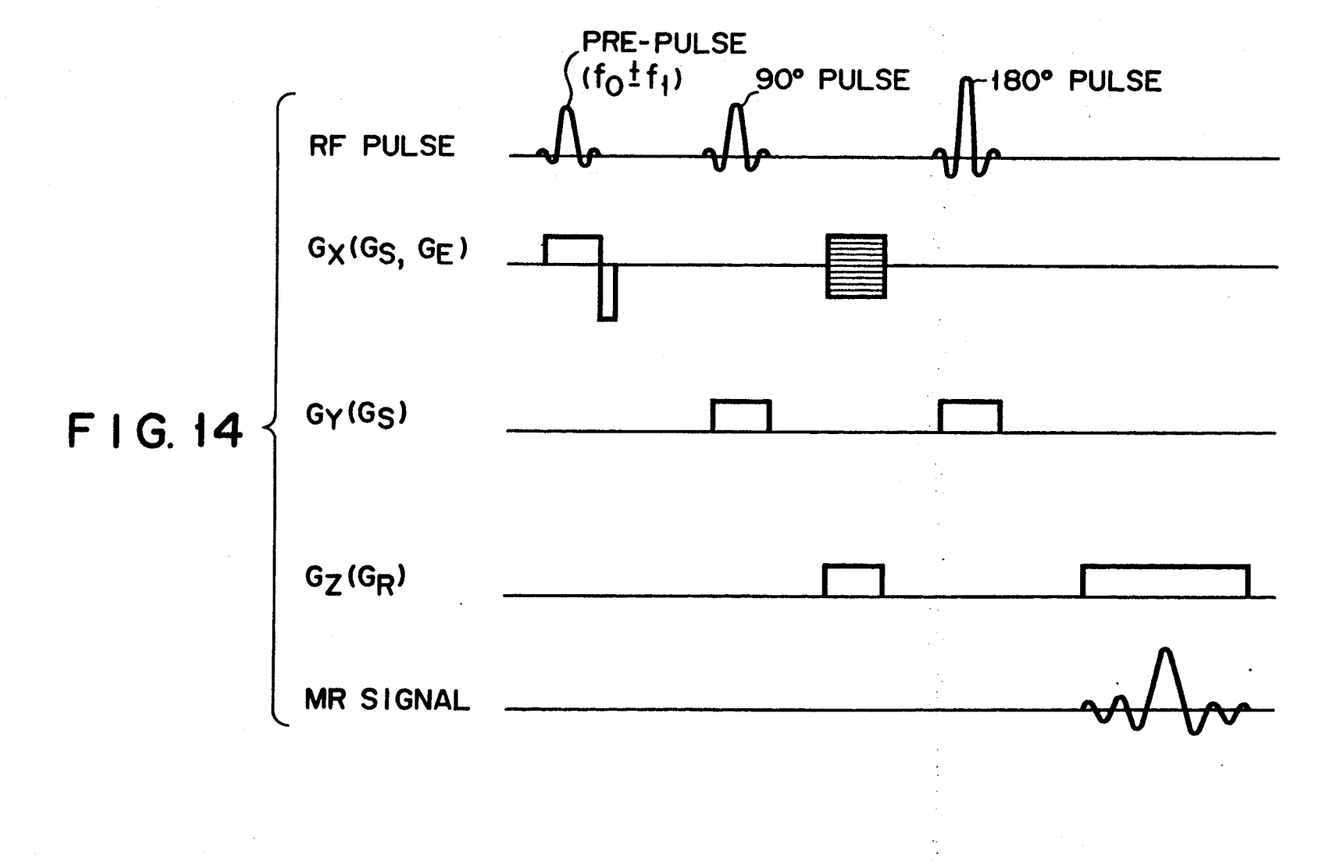

FIG. 14 illustrates a pulse sequence for use in the ninth embodiment of an MR imaging system according to the present invention, which can selectively saturate the sagittal slices S1 and S2 at the same time.

In this case, the sagittal slices S1 and S2 can be selectively saturated by a single application of a prepulse of a frequency $f_0 \pm f_1$ having a carrier with a frequency component $f_0 + f_1$ and a frequency component $f_0 - f_1$ being combined, using this pre-pulse and the X gradient field $G_X$ for slicing ($G_S$). Therefore, there is no timing lag in excitation/saturation between the sagittal slices S1 and S2, and significantly accurate comparison of blood speed information can be easily done using the blank portions of both slices S1 and S2 appearing on the slice image of the coronal slice S3.

Figure 15:
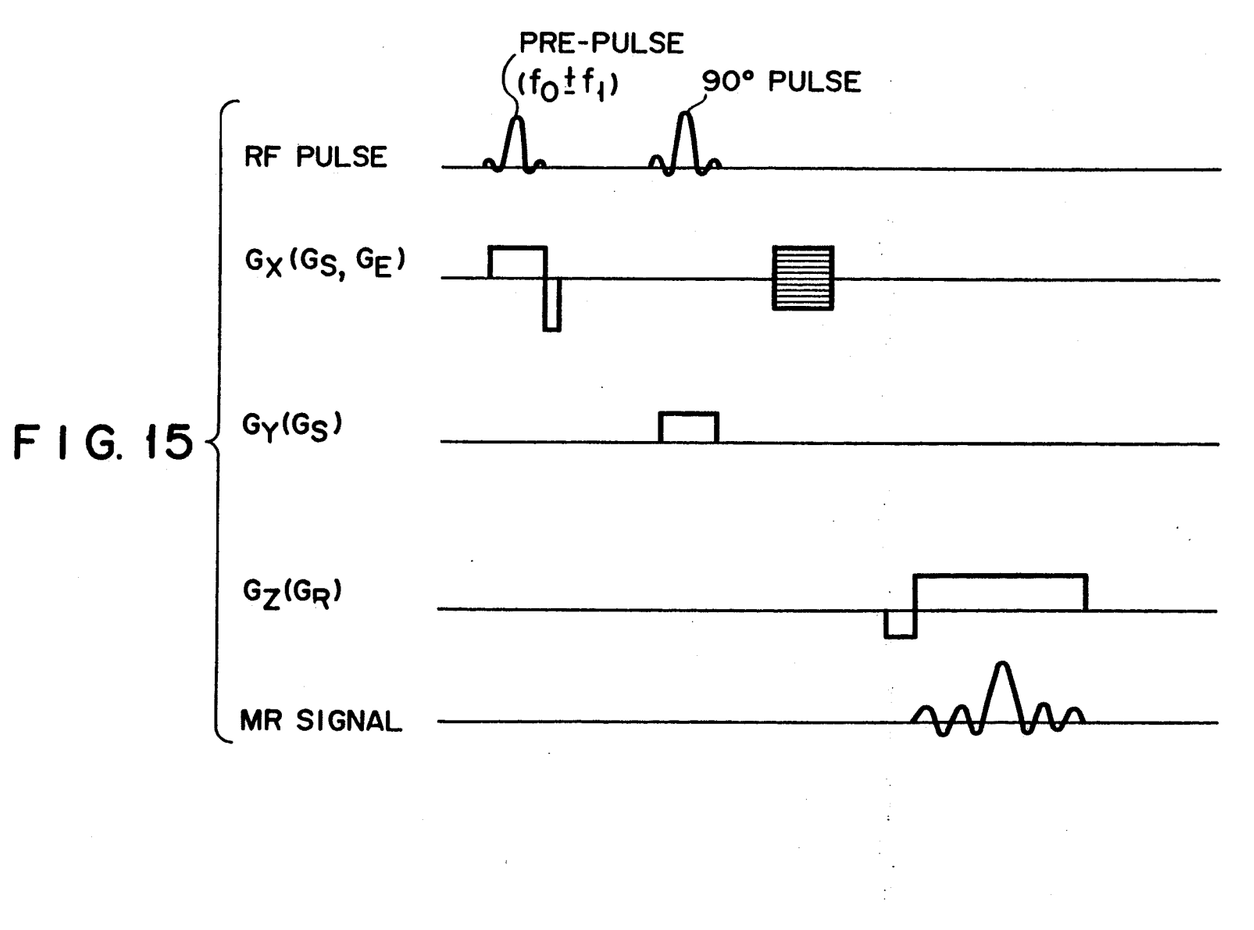

FIG. 15 illustrates a pulse sequence for use in the tenth embodiment of an MR imaging system according to this invention, which is provided by applying the selective excitation method shown in FIG. 14 to the embodiment shown in FIG. 10. In this case also, the sagittal slices S1 and S2 can be selectively saturated by a single application of a pre-pulse of a frequency $f_0 \pm f_1$ having a carrier with a frequency component $f_0 + f_1$ and a frequency component $f_0 - f_1$ being combined, using this pre-pulse and the X gradient field $G_X$ for slicing ($G_S$).

In the above-described embodiments, the sagittal slices S1 and S2 to be excited for "tagging" are set so that they respectively include the entire right kidney and the entire left kidney. For a purpose of comparing of blood speed information of, for example, renal veins, however, the slices may be thin ones that include at least those portions of the object P where the renal veins run out from the right and left kidneys.

Although imaging of the blood speeds in the renal veins in the right and left kidneys is described in the foregoing description of the individual embodiments, the present invention is not limited to this particular case, but may apply to imaging of motion at a plurality of portions whose comparison is significant, as in a blood vessel system where a plurality of blood vessels join.

Depending on the quantity of pieces of motion information to be compared, the number of regions to be saturated using a pre-pulse is not limited to two but may be set equal to or greater than three. The pre-pulse is not limited to a 90° pulse, as long as it is a high-frequency pulse having a flip angle close to that of the former pulse. For instance, the angle of a magnetization vector at the time of exciting a portion to be imaged can be made close to 90° by setting the flip angle slightly larger than 90°.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A magnetic resonance imaging system for diagnosing right and left kidneys of a subject, comprising:
    means for selectively exciting and saturating a first and a second sagittal slice, said first sagittal slice including said right kidney where blood flows in renal veins and said second sagittal slice including said left kidney where blood flows in renal veins; and means for imaging including means for selectively exciting a coronal slice which includes the right and left kidneys where blood flows in renal veins said coronal slice intersecting said first and second sagittal slices to cause a magnetic resonance before said magnetic resonance caused by said selective exciting and saturating means is relaxed, means for collecting a magnetic resonance signal, and means for acquiring a magnetic resonance image of said coronal slice based on said magnetic resonance signal.

2. A system according to claim 1, wherein said selective exciting and saturating means includes means for applying a pre-pulse consisting of a high-frequency selective excitation pulse including carriers of two different frequencies and a gradient field pulse to said object.

3. A system according to claim 1, wherein said selective exciting and saturating means includes means for applying a combination of a pre-pulse consisting of a high-frequency selective excitation pulse and a gradient field pulse to said object for two times and means for sequentially changing a carrier frequency of said pre-pulse.

4. A system according to claim 1, wherein said means for selectively exciting and saturating includes means for applying a combination of a pre-pulse consisting of a high-frequency selective excitation pulse and a gradient field pulse to said object for a plurality of times while sequentially changing an amplitude to said gradient field pulse.

5. A system according to claim 1, wherein said means for selectively exciting and saturating includes means for applying a combination of pre-pulse consisting of a high-frequency selective excitation pulse and a gradient field pulse to said object for a plurality of times while sequentially changing a combination of a carrier frequency of said pre-pulse and an amplitude of said gradient field pulse.

6. A system according to claim 1, wherein said means for selectively exciting and saturating including means for applying a combination of a pre-pulse consisting of a high-frequency selective excitation pulse and a gradient field pulse to said object for a plurality of times while sequentially changing at least one of a carrier frequency of said pre-pulse and a gradient direction of said gradient field pulse.

7. A system according to claim 1, wherein said collecting means includes means for collecting a pulse spin echo magnetic resonance signal.

8. A system according to claim 1, wherein said collecting means includes means for collecting a gradient field echo magnetic resonance signal.

9. A system according to claim 1, wherein said acquiring means includes means for Fourier transforming said magnetic resonance signal to said magnetic resonance image of said coronal slice.

10. A magnetic resonance imaging method for diagnosing right and left kidneys of a subject, comprising:

selectively exciting and saturating a first and a second sagittal slice, said first sagittal slice including said right kidney where blood flows in renal veins and said second sagittal slice including said left kidney where blood flows in renal veins;

selectively exciting a coronal slice which includes the first and second kidneys where blood flows in renal veins intersecting said first and second sagittal slices to cause a magnetic resonance before said magnetic resonance occurring in said selective exciting and saturating step is relaxed;

collecting a magnetic resonance signal; and acquiring a magnetic resonance image of said coronal slice based on said magnetic resonance signal.

11. A method according to claim 10, wherein said selective exciting and saturating step includes applying a pre-pulse consisting of a high-frequency selective excitation pulse including carriers of two different frequencies and a gradient field pulse to said object.

12. A method according to claim 10, wherein said selective exciting and saturating step includes applying a combination of a pre-pulse consisting of a high-frequency selective excitation pulse and a gradient field pulse to said object while sequentially changing a carrier frequency of said pre-pulse.

13. A method according to claim 10, wherein said selectively exciting and saturating step includes a step for applying a combination of a pre-pulse consisting of a high-frequency selective excitation pulse and a gradient field pulse to said object for a plurality of times while sequentially changing a amplitude of said gradient field pulse.

14. A method according to claim 10, wherein said selectively exciting and saturating step includes a step for applying a combination of a pre-pulse consisting of a high-frequency selective excitation pulse and a gradient field pulse to said object for a plurality of times while sequentially changing a combination of a carrier frequency of said pre-pulse and an amplitude of said gradient field pulse.

15. A method according to claim 10, wherein said selectively exciting and saturating step includes a step for applying a combination of a pre-pulse consisting of a high-frequency selective excitation pulse and a gradient field pulse to said object for a plurality of times while sequentially changing at least one of a carrier frequency of said pre-pulse and a gradient direction of said gradient field pulse.

16. A method according to claim 10, wherein said collecting step collects a pulse spin echo magnetic resonance signal.

17. A method according to claim 10, wherein said collecting step collects a gradient field echo magnetic resonance signal.

18. A method according to claim 10, wherein said acquiring step includes Fourier transforming said magnetic resonance signal into said magnetic resonance image of said coronal slice.

* * * * *